United States Patent [19]

Brewer

[11] Patent Number: 5,450,083

[45] Date of Patent: Sep. 12, 1995

[54] TWO-STAGE DECIMATION FILTER

[75] Inventor: Robert J. Brewer, Lambourn, England

[73] Assignee: Analog Devices, Inc., Norwood, Mass.

[21] Appl. No.: 208,931

[22] Filed: Mar. 9, 1994

[51] Int. Cl.$^6$ .......................................... H03M 3/00
[52] U.S. Cl. .................................. 341/143; 364/724.1
[58] Field of Search ................. 341/143, 155; 375/30, 375/33; 364/724.1

[56] References Cited

U.S. PATENT DOCUMENTS

| | | | |
|---|---|---|---|
| 4,940,977 | 7/1990 | Mandell | 341/143 |
| 4,972,436 | 11/1990 | Halim et al. | 341/143 X |
| 5,079,734 | 1/1992 | Riley | 364/724 |
| 5,212,659 | 5/1993 | Scott et al. | |

OTHER PUBLICATIONS

Leung, B. H., "Design Methodology of Decimation Filters for Over-sampled ADC Based on Quadratic Programming", IEEE Transactions on Circuits and Systems, 38, No. 10, pp. 1121–1132, Oct., 1991.

Noonan, J. P. et al., "Data Compression of A +1, −1 and 0 Representation", IEEE, pp. 304–305, 1989.

Ping Wah Wong and Robert M. Gray, "FIR Filters with Sigma–Delta Modulation Encoding", IEEE Transactions on Acoustics, Speech, and Signal Processing, vol. 38, No. 6, Jun. 1990.

Primary Examiner—Howard L. Williams
Attorney, Agent, or Firm—Wolf, Greenfield & Sacks

[57] ABSTRACT

A digital filter includes a pre-filter cascaded to a low pass filter. The pre-filter has a transfer function providing generally increasing attenuation with increasing frequency above a cutoff frequency. The low pass filter has a transfer function providing substantially decreasing attenuation with increasing frequency above the cutoff frequency. The low pass filter is an FIR filter including coefficients restricted to the set $\{+1, 0$ and $-1\}$. The filters are preferably implemented using simple hardware such as addressable read/write RAM, digital adder/subtracters, and registers. Alternatively, the addressable RAM can be replaced with shift registers. Such a filter is easily and economically implemented and has a favorable overall frequency response characteristic. The filter is, therefore, well suited for use in many digital applications and, in particular, for use as a decimation filter in an oversampled, multi-bit, high order analog-to-digital converter system.

21 Claims, 5 Drawing Sheets

TWO-STAGE DECIMATION FILTER

FIELD OF THE INVENTION

The present invention relates to digital low pass filters and, more particularly, to easily-implemented, high-performance two-stage decimation filters.

BACKGROUND OF THE INVENTION

Digital filters have widespread use due to the recent advancement of digital signal processing technology. Applications for digital filters include, for examples, their use in analog-to-digital converter (ADC) and digital-to-analog converter (DAC) systems. With known oversampling techniques, DACs and ADCs can reproduce signals at very high levels of accuracy. Sigma-delta noise shaping is one such technique which enables converters to achieve high signal-to-noise ratios with relatively simple hardware. Digital decimation filters are commonly used in sigma-delta ADC systems to decimate and filter the digital output samples from an oversampling modulator to reduce the high frequency quantization noise component in the signal.

Prior art digital decimation filters, used in multi-bit oversampled ADC systems, suffer from a number of drawbacks. Prior to about 1990, such filters were expensive and difficult to implement due to complex hardware requirements. The filters also consumed a lot of power. Burdensome design constraints existed at the time because it was assumed that the multi-bit data words to be filtered had to be multiplied by multi-bit coefficients at high sampling rates. This assumption necessitated filter hardware such as multiple high speed array multipliers (which are expensive and consume a large amount of area - i.e., "real estate" on an integrated circuit "chip"), among other elements, resulting in the aforementioned drawbacks.

In 1990, P. W. Wong and R. M. Gray, in "FIR Filters with Sigma-Delta Modulation Encoding", *IEEE Trans. on Acous., Speech and Signal Proc.*, Vol. 38, p. 979–990, June 1990, which article is herein incorporated by reference, taught that digital finite impulse response (FIR) filters could be realized with truncated filter coefficients restricted to the set $\{+1, 0 \text{ and } -1\}$. Such FIR filters are easy and inexpensive to implement with simple hardware (which does not include multipliers). Additionally, such filters have frequency response characteristics with good stop-band attenuation (cutoff) near the transition frequency. The frequency response of these filters, however, includes poor stop-band attenuation at frequencies above the transition or cutoff frequency. In particular, at such higher frequencies, the frequency response includes stop-band ripple which increases with increasing frequency (the attenuation substantially decreases with increasing frequency above the transition or cutoff frequency). While inexpensive and easily implementable, the deleterious high frequency characteristics of these filters prevents effective use in certain applications. For example, such a filter is not sufficiently effective at reducing high frequency quantization noise in a multi-bit, high order, oversampled ADC system. Accordingly, a general object of the present invention is to provide a digital filter having acceptable high frequency stop-band attenuation which is relatively simple and inexpensive to implement.

SUMMARY OF THE INVENTION

The aforementioned drawbacks of the prior art digital filters are overcome by a multiple-stage digital decimation filter of the present invention in which a pre-filter and a low pass filter are cascaded, the multiple-stage filter being easy to implement and having a good overall frequency response characteristic.

More particularly, according to the invention, the digital decimation filter includes a pre-filter which receives an input digital signal and provides an intermediate output signal. The pre-filter has a filter characteristic including generally increasing attenuation with increasing frequency above a cutoff frequency. A low pass filter is cascaded with the pre-filter and receives the intermediate output from the pre-filter. The low pass filter provides an output digital signal and has a filter characteristic including substantially decreasing attenuation with increasing frequency above the cutoff frequency. The overall filter frequency response characteristic includes desirable stop-band attenuation both near the cutoff frequency and at higher frequencies.

In accordance with the preferred embodiment of the present invention, the filter includes filter coefficients for the low pass filter restricted to the set $\{+1, 0 \text{ and } -1\}$. Additionally, in accordance with a preferred embodiment of the present invention, the pre-filter includes circuitry for producing a running average of a finite number of samples of the input digital signal. Further, in accordance with a preferred embodiment of the present invention, the circuitry of the pre-filter includes a first memory element storing a finite number of samples of the digital input signal, and a digital adder/subtracter, coupled to the first memory element, for adding to the running average a first sample in the first memory element and subtracting from the running average a last sample in the first memory element.

Other advantages, novel features and objects of the invention will become apparent from the following detailed description of the present invention when considered in conjunction with the accompanying drawing.

DETAILED DESCRIPTION

Figure 1:
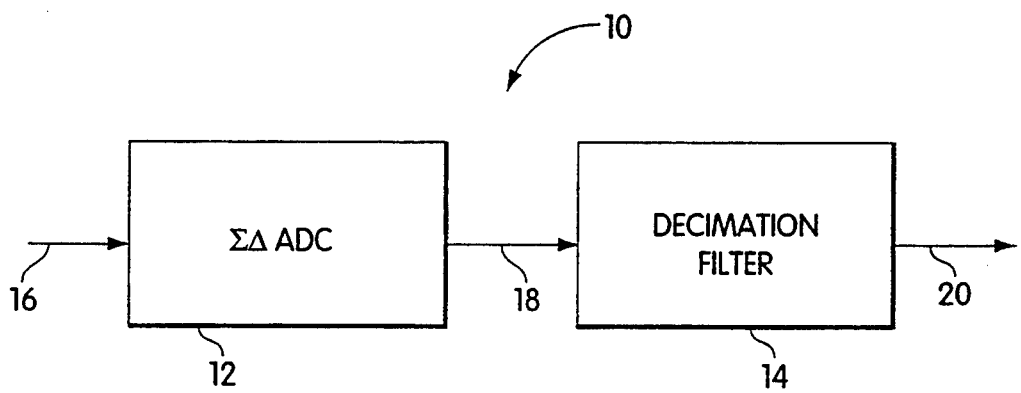
FIG. 1 is a general block diagram of a prior art ADC system.

Referring to FIG. 1, a block diagram of a prior art sigma-delta ADC is shown. As shown, the system 10 includes a sigma-delta ADC 12 and a digital decimation filter 14. The sigma-delta ADC receives an analog input signal on input lead 16 and provides therefrom digital output samples at a certain rate on output connector 18. The sigma-delta ADC 12 operates at a certain rate to produce oversampled (i.e., sampled at a rate greater than the Nyquist rate) digital output samples. The certain rate (which is related to the oversampling ratio of the ADC) is selected to produce output samples having a desired number of bits. As one skilled in the art will appreciate, as the order of the ADC increases, the oversampling ratio can be reduced to achieve the same accuracy. The sigma-delta ADC 12 also conventionally shapes the frequency spectrum of quantization noise so that the majority of the noise lies above the frequency band of the signal to be reproduced (i.e., the passband of the decimation filter).

The digital decimation filter 14 receives the digital output signal on connector 18 and conventionally decimates the digital output signal to produce a filtered output signal on terminal 20 at a desired data rate. The decimation filter 14 filters out most of the quantization noise energy, thereby increasing the signal-to-noise ratio (and hence the dynamic range) of the system.

Figure 2:
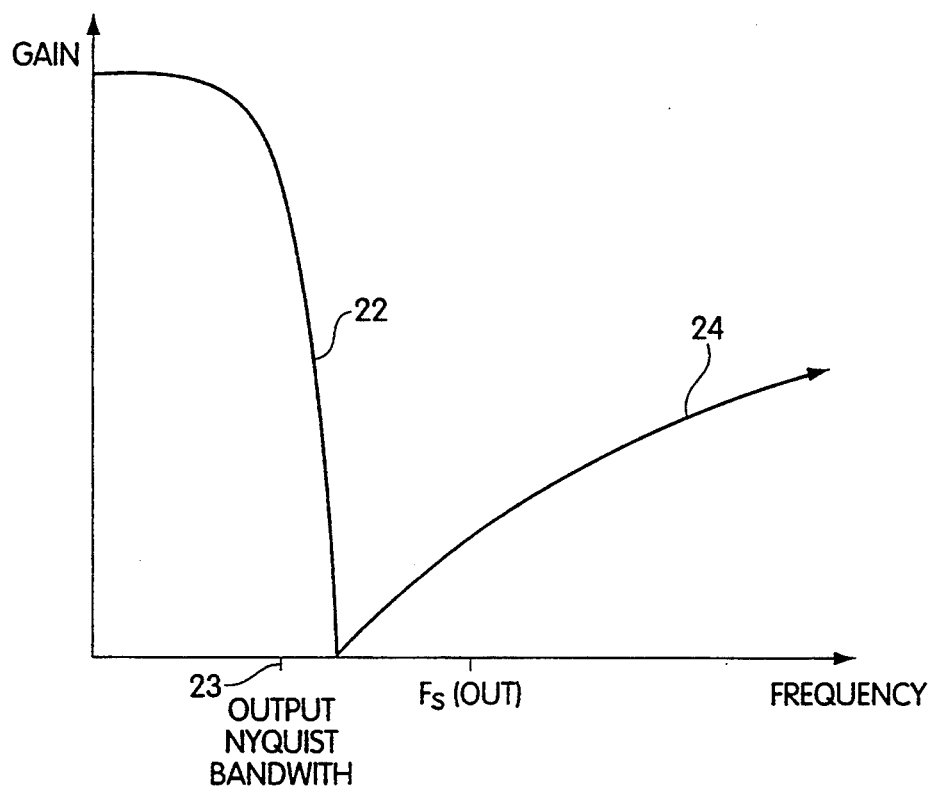
FIG. 2 is a frequency response diagram of a prior art digital filter.

The prior art Wong and Gray digital decimation filter is economically built with simple digital circuitry which implements a transfer function equivalent to that of an FIR filter having filter coefficients restricted to the set $\{+1, 0 \text{ and } -1\}$. The Wong and Gray filter has a frequency response characteristic with good stop-band attenuation near the transition frequency but poor stop-band attenuation at higher frequencies. The frequency response characteristic of such a filter is shown in FIG. 2. As shown, the filter produces a relatively sharp cut-off (shown at 22) near the transition frequency 23 (shown, for example, as the Nyquist bandwidth output upper frequency) but has increasing stop-band ripple (decreasing attenuation) at higher frequencies (shown at 24). Thus, in applications where it is important to reduce high frequency components of a digital signal, such a filter is not effective. The Wong and Gray filter is, therefore, not well suited to serve as a decimation filter in a multi-bit, high order, sigma-delta ADC.

Figure 3:
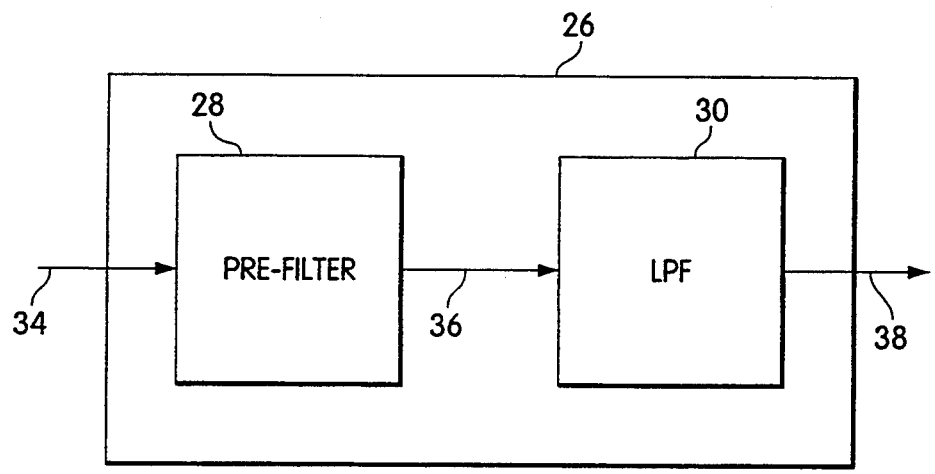
FIG. 3 is a block diagram of a digital filter of the present invention.

FIG. 3 shows a block diagram of a digital decimation filter 26 according to the present invention. As shown, the filter 26 includes a pre-filter 28 and a low pass filter 30 cascaded together. Pre-filter 28, implements a sinc (or sinx/x) function. Pre-filter 28, therefore, has a frequency response characteristic which includes decreasing stop-band ripple (increasing attenuation) at frequencies above the transition frequency. The low pass filter 30 is an FIR filter having coefficients restricted to the set $\{-1, 0, +1\}$.

During operation, pre-filter 28 receives a digital input signal on input lead 34 and pre-filters this digital input signal to attenuate high frequency noise. An intermediate output signal is provided on lead 36 to second filter 30. Second filter 30 then filters this intermediate output signal, further attenuating high frequency signal components (i.e., noise), and provides a filtered output signal on lead 38.

Figure 4:
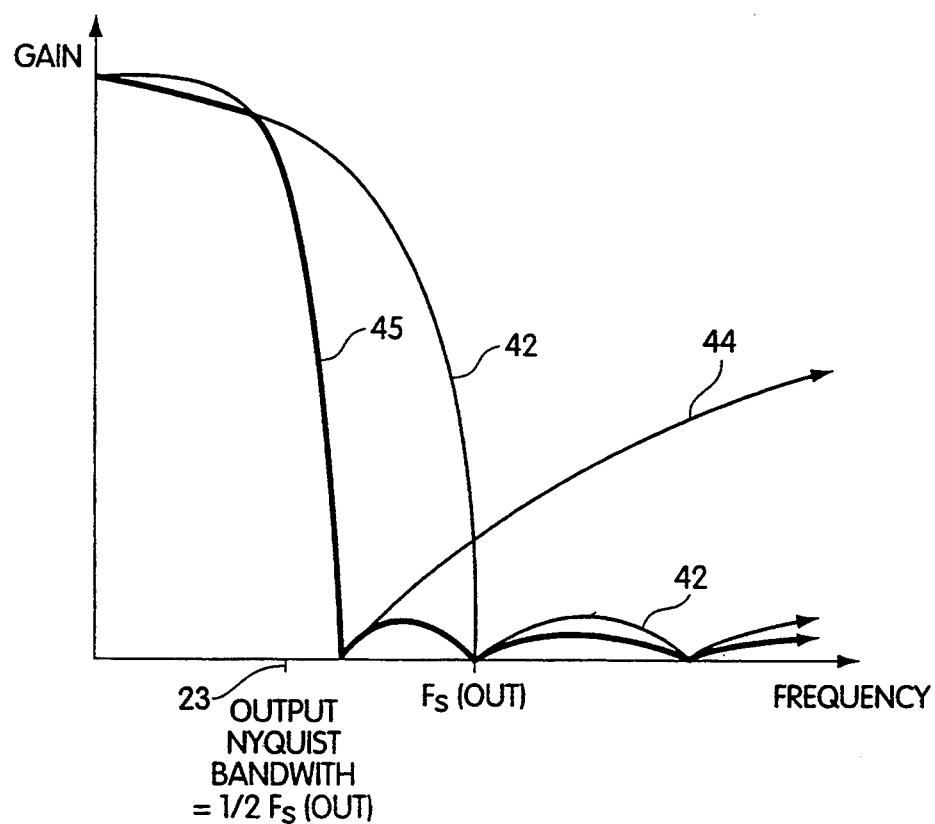
FIG. 4 is a frequency response diagram of a digital filter of the present invention.

FIG. 4 is a diagram illustrating the magnitude of the frequency response characteristic of a filter 26 according to the present invention. The diagram illustrates the frequency response characteristic 42 of the pre-filter 28 superimposed on the frequency response characteristic 44 of the low pass filter 30. Those skilled in the art will appreciate that the overall filter characteristic 45 (shown as a darkened line) is equal to the product of the two filter characteristics and includes the area of overlap between the two filter characteristics.

As shown, the frequency response characteristic 42 of the pre-filter 28 has good high frequency attenuation (the attenuation generally increases with increasing frequency above the transition frequency) whereas the frequency response characteristic 44 of filter 30 has poor high frequency attenuation (the attenuation decreases with increasing frequency above the transition frequency). However, the frequency response characteristic 44 of the filter 30 has a sharper cutoff near the transition frequency than does the frequency response characteristic 42 of prefilter 28. As shown, $F_s(out)$ is the frequency of the output samples (after decimation). In the example shown, pre-filter 28 is designed to have a first zero at the output frequency $F_s(out)$. Thus, the overall frequency response characteristic 45 of filter 26 has good stop-band attenuation near the transition frequency and at higher frequencies.

While one pre-filter 28 is shown in FIG. 3, it should be appreciated that multiple pre-filters 28 can be cascaded to compensate for the deleterious high-frequency characteristics of the low pass filter 30. Such a cascaded arrangement has the transfer function: $A = A_0(-\sin\pi F/\pi F)^N$ where $F = F_{signal}/F_{sample}$, $F_{signal}$ is the frequency, in Hz, of a particular component of the input waveform, $F_{sample}$ is the input sampling frequency, in Hz, divided by the number of samples summed in the running sum, $A_0$ is the amplitude of that particular component of the input waveform which has frequency $F_{signal}$, and N is the number of cascaded filters.

Figure 5:
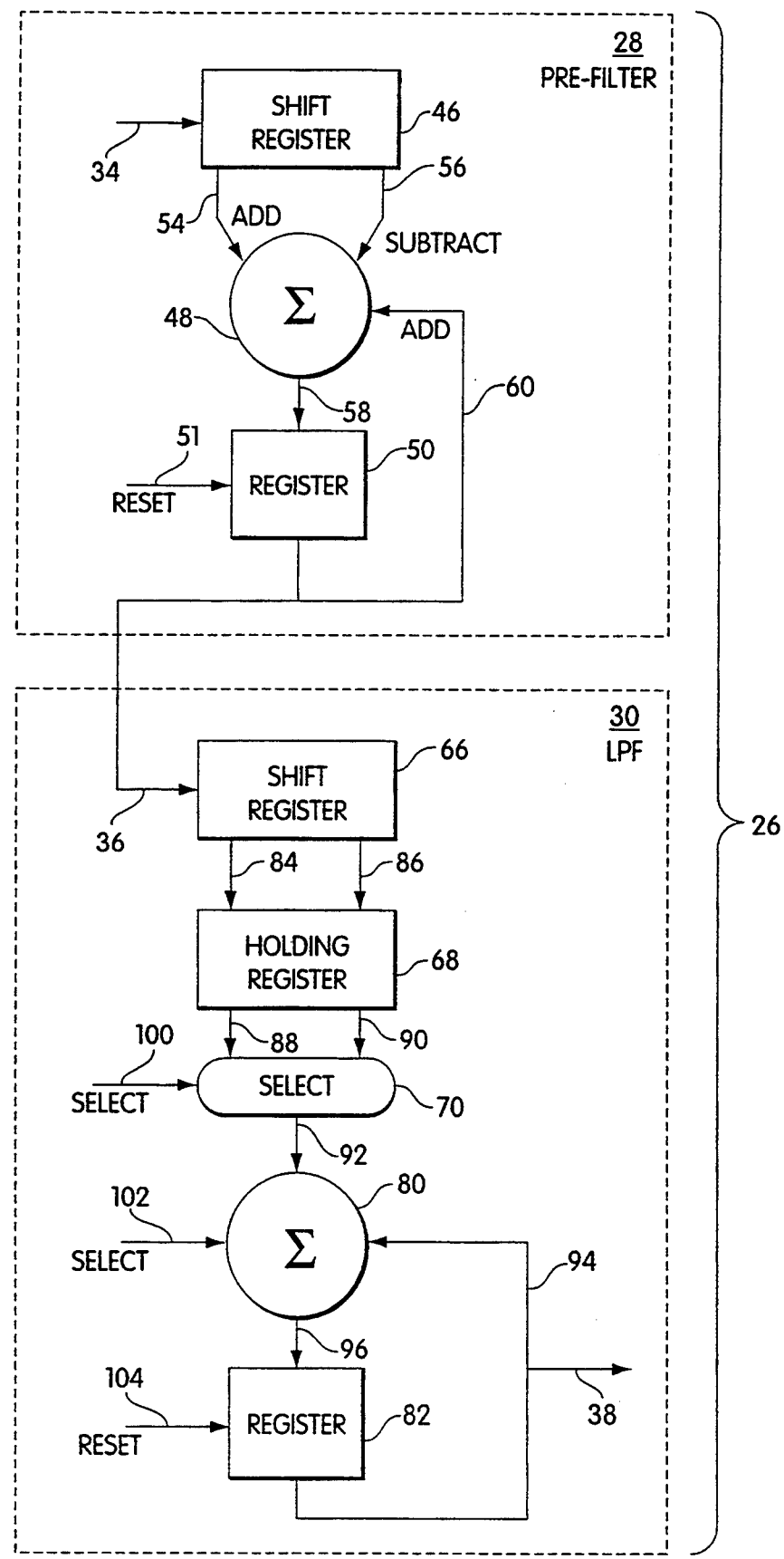
FIG. 5 is a schematic diagram of a first embodiment of a digital filter of the present invention.

FIG. 5 is a schematic diagram of a digital filter 26 according to the present invention. As shown, filter 26 includes pre-filter 28 and low pass filter 30, cascaded. Pre-filter 28 is implemented using a shift register 46, a digital adder/subtracter 48, and a register 50. Pre-filter 28 operates to keep a "running sum" of a number of samples of the digital input signal. The running sum is continually updated and is provided as an intermediate output on lead 36 to filter 30.

During operation, a digital input signal is received on input lead 34 by shift register 46. Shift register 46 conventionally operates to input each "new sample" received currently (indicated as supplied at the left side of the shift register in FIG. 5) and output the "last sample", where the "last sample" is the sample that was input n clock cycles earlier and n is the word (or sample) length of the shift register in clock cycles. Each sample is equal to the number of bits in each multi-bit word if the input signal is a multi-bit signal or is equal to 1 bit if the input signal is a 1-bit signal. Shift register 46 is of a finite length. It will be apparent that a longer shift register produces a more accurate running average. However, as will be appreciated by those skilled in the art, a shorter (i.e., smaller) shift register is easier to implement. As will be understood by those skilled in the art, the length of the shift register is determined by the required frequency of the first zero in the filter frequency response. Typically, the first zero is desired to be at Fs(out) as shown in FIG. 4. By way of example, a 16-word shift register, with each word (sample) being 4 bits in length, is suitable for a 4-bit 32 MHz digital input signal where it is desired to output 2 Msamples/sec. Similarly, a 16-bit shift register is suitable for a 1-bit digital input stream.

Each time a new sample is received by shift register 46, the adder/subtracter 48 adds the new sample to, and subtracts the last sample from, the then-current contents (running sum) of register 50. The result of those operations is restored in register 50. The new sample is provided to adder/subtracter 48 along line 54 and the last sample is provided to adder/subtracter 48 along line 56. The then-current output of register 50 is provided to adder/subtracter 48 along line 60 and the result is provided to register 50 along line 58.

Adder/subtracter 48 both subtracts the last sample from the new sample and adds the difference to the then-current contents of the register 50. The sum is provided along line 36 to filter 30 and restored in the register 50. Adder/subtractor 48 could be a two-input or a three(or more)-input adder/subtractor. If a two-input adder/subtractor is used, the rate of operation of the adder/subtracter 48 must be twice that of the digital input signal. For example, if the digital input signal is a 4-bit 32 MHz signal, the adder/subtracter 48 would operate at 64 MHz. If a three-input adder/subtractor is used, the rate of operation of the adder/subtractor would be equal to that of the input signal (i.e., 32 MHz in the above example).

Register 50 may be initialized by resetting the register to digital value zero in response to a reset signal applied on line 51. When in use as a decimation filter in an oversampled ADC system, the initialization is preferably performed while the analog input to the ADC is connected to ground potential (or other voltage value for which it is desired to cause the ADC output to be zero).

Filter 30 receives the intermediate output (running sum) from pre-filter 28 along line 36. Filter 30 essentially performs a convolution operation. Filter 30 includes a shift register 66, a holding register 68, a select module 70, an adder/subtracter 80 and a register 82. Shift register 66 is of a finite length and successively stores the samples of the intermediate output signal received from pre-filter 28. By way of example, shift register 66 and holding register 68 are described as 32-word shift registers, each for storing thirty-two multi-bit words. However, one skilled in the art will appreciate that such shift registers could be of different lengths. In this example, thirty-two samples of the digital intermediate output signal received on line 36 are stored in the shift register 66, which is clocked repetitively at a 32 MHz data rate. Once every 0.5 μs, the thirty-two words are parallel loaded through n-bit buses 84 and 86 (buses 84 and 86 are a graphical representation of thirty-two n-bit buses where n is the number of bits in the intermediate output signal, as will be understood by those skilled in the art) into shift register 68 for processing.

The thirty-two words stored in shift register 68 are sequentially selected by select module 70 to be added to, or subtracted from, by adder/subtracter 80, the then-current result stored in register 82. The control signal on select line 100 controls operation of select module 70 while adder/subtracter 80 is controlled by select line 102. Data samples are fed from shift register 68 along n-bit buses 88 and 90 through select module 70 and along line 92 to adder/subtracter 80. The contents of register 82 are fed along line 94 to adder/subtracter 80 and the new result is provided to register 82 along line 96. The contents of register 82 are output along line 98 every 0.5 μs at which time the register is reset to zero. The reset signal on reset line 104 controls the reset operation of register 82.

Those skilled in the art will appreciate that the act of adding performs an identical operation to that of multiplying by a filter coefficient of +1, the act of subtracting performs an identical operation to that of multiplying by a filter coefficient of −1, and not performing any operation is identical to that of multiplying by a filter coefficient of 0. Thus, the filter can be realized without any multiplier elements. Additionally, as will be understood by those skilled in the art, the cutoff frequency of the filter is controlled by the select module which controls the mathematical operation of the adder/subtractor.

Additionally, as those skilled in the art will appreciate, a longer shift register than that described can be employed without increasing the speed of the adder/subtracter 80. This is so because no operation is required for a 0-value filter coefficient. It is also well known that in the case of a symmetrical filter of odd length, symmetrical pairs of data words may be pre-added in an unconditional adder, prior to the selective adder/subtracter 80. This permits a further increase in the length of the shift register and, thus, length of the filter (by a factor of 2) with the addition of one unconditional adder. Thus, the filter length could be greater than that described.

Figure 6:
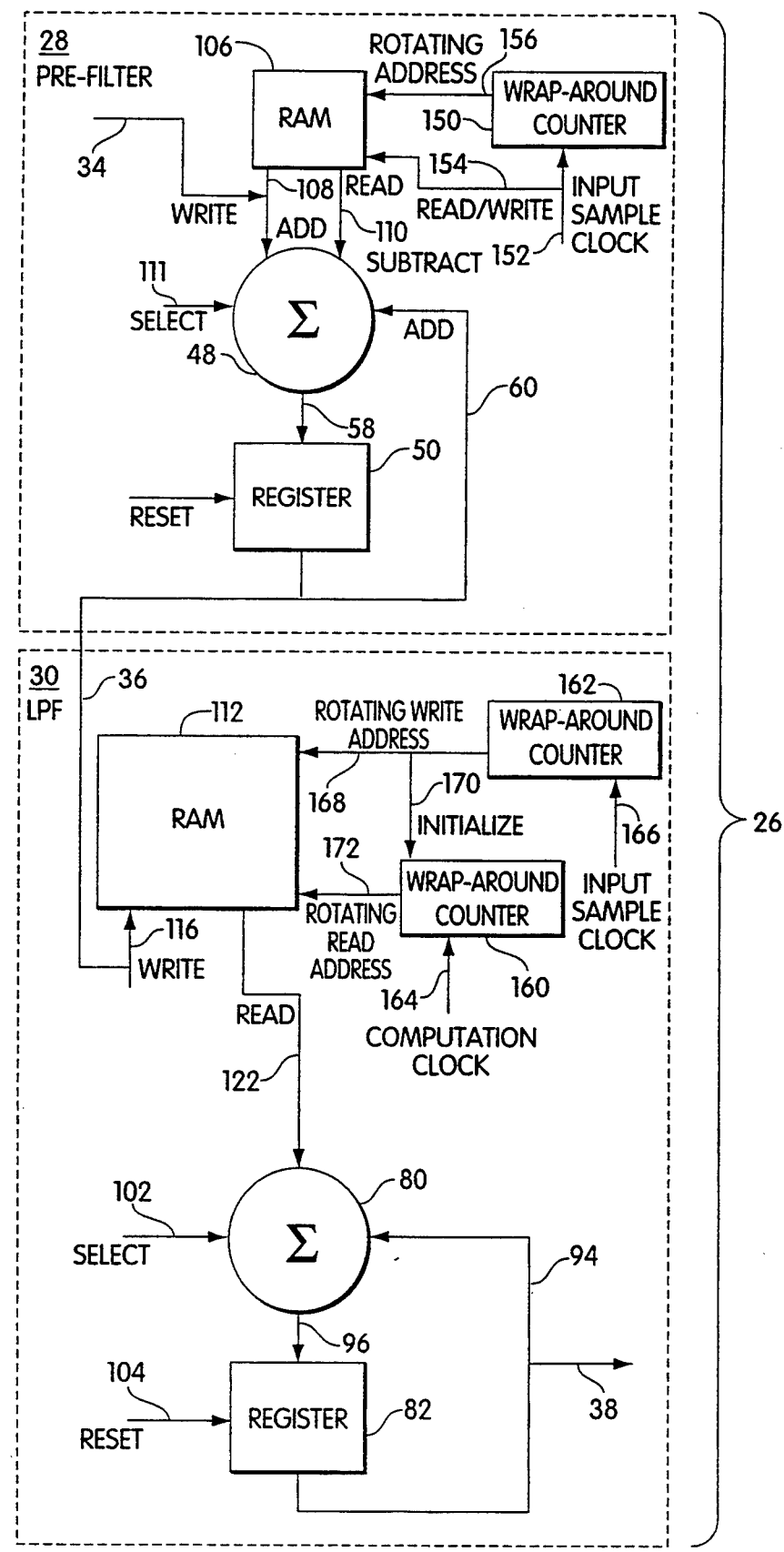
FIG. 6 is a schematic diagram of another embodiment of a digital filter of the present invention.

Similarly, while shift registers have been shown and described for storing the data samples, other storage elements could be used. For example, data random access memory (RAM) could be used, in which the data does not physically move within the array of storage elements as it does within a shift register. Rather the equivalent function is achieved by rotating read and write address pointers. Such an embodiment is shown in the diagram of FIG. 6. This is a preferred embodiment. Like reference numerals in FIG. 6 represent same elements to those in FIG. 5.

By comparison with FIG. 5, shift register 46 of pre-filter 28 is replaced with RAM element 106. Buses 108 and 110 are used for writing to and reading from the RAM element, respectively. RAM element 106 is controlled by a read/write select line 154 to either read from, or write to, a location within the RAM element addressed by the rotating address pointer 156. The rotating address pointer 156 is updated by a value stored in wrap-around counter 150 which value is incremented by the input sample clock received on line 152. At each clock cycle of the input sample, the last data word is read from the RAM element 106 at a location addressed by the rotating address pointer 156. The last data word is fed along bus 110 to adder/subtractor 48. The last data word is subtracted from the running sum and restored in register 50. The new input data word on line 34 is fed along bus 108 and written to the same location within RAM element 106 addressed by rotating address pointer 156 from which the last word was just previously read. The new word replaces the last word in the RAM element 106. The new word is also fed along bus 108 to adder/subtractor 48 which adds the new word to the running sum. The wrap-around counter is then incremented after each clock cycle (during which the last word is read from, and the new word is written to, the RAM element) which, in turn, updates the rotating address pointer 156. The operation of pre-filter 28 is otherwise identical to that described above with reference to FIG. 5.

In filter 30, dual-port RAM element 112 replaces shift register 66 and register 68. RAM element 112 includes a rotating write address pointer 168 for accessing locations to be written to and a rotating read address pointer 172 for accessing locations to be read from. The rotating write address pointer 168 is updated by the value stored in the wrap-around counter 162 which value is incremented at each clock cycle of the input sample clock received on line 166. The rotating read address pointer 172 is updated by the value stored in wrap-around counter 160 which value is incremented at each cycle of a computation clock received on line 164. Bus 116 is used to write data words to locations in the RAM element 112 addressed by write address pointer 168 and bus 122 is used to read data from locations within RAM element 112 addressed by read pointer 172. A new data word is written to a location within the RAM element once per each input clock cycle. Each new word overwrites the last data word. Thus, at any time, the RAM element contains the p most recent input samples, where p is the length of the RAM element (or values to be convolved during the convolution operation). That function corresponds to that of register 66 in FIG. 5.

Wrap-around counter 160 is initialized by initialization line 170 to the same value stored in wrap-around counter 162 such that the read address pointer points to the same location as the write address pointer 168. Wrap-around counter 160 is incremented (by the computation clock) at a higher rate than is wrap-around counter 162 so that the read pointer 172 "runs ahead" of write pointer 168. Thus, data is read from the RAM element before data is written to the same location. The computation clock rate is equal to p× the output sample rate, where p is the number of coefficients in the convolution. The data read is fed along bus 122 to adder/subtractor 80. That function corresponds to that carried out by register 68 in FIG. 5. The convolution operation of the low pass filter 30 otherwise operates as described above in connection with the embodiment of FIG. 5.

Those skilled in the art will recognize that variations in the detail of the embodiment of FIG. 6 can be made suit a particular application. In particular, the values of p and the ratio of the input sample rate to the output sample rate may differ which will effect the clocking of the wrap-around counters, at a minimum. If the computation clock and the input sample clock rate are substantially similar, the size of the RAM element may be reduced. The size of the RAM element is, in fact, determined by the number of data words by which the read pointer is ahead of the write pointer during each convolution operation. Additionally, a single port RAM element, which consumes less area on an integrated circuit, may be used if the element is sufficiently fast to permit time-multiplexed read and write operations within the computation clock cycle. As will be appreciated by those skilled in the art, the addressing scheme must be modified for use with a single port RAM element.

Those skilled in the art will also appreciate that data words, for which the multiplying coefficient in the convolution operation is equal to zero, are not required to be read from the RAM element. To take advantage of this available economy and processing speed, the counter generating the rotating read address would, in a preferred embodiment, be incremented not by a simple clock but at each cycle by a value output from a ROM look-up table (not shown) which stores the number of successive zeros following each non-zero coefficient in the convolution coefficient sequence. This preferred scheme reduces the computation clock rate to m× the output sample rate, where m is the number of non zero coefficients, as the read address pointer "jumps" over the locations in the RAM element where the corresponding multiplying coefficient is zero.

The RAM-based implementation of the present invention, shown in FIG. 6, is the preferred embodiment of the present invention because the data remains physically stationary within the storage element (RAM) while the address pointers move.

Figure 7:
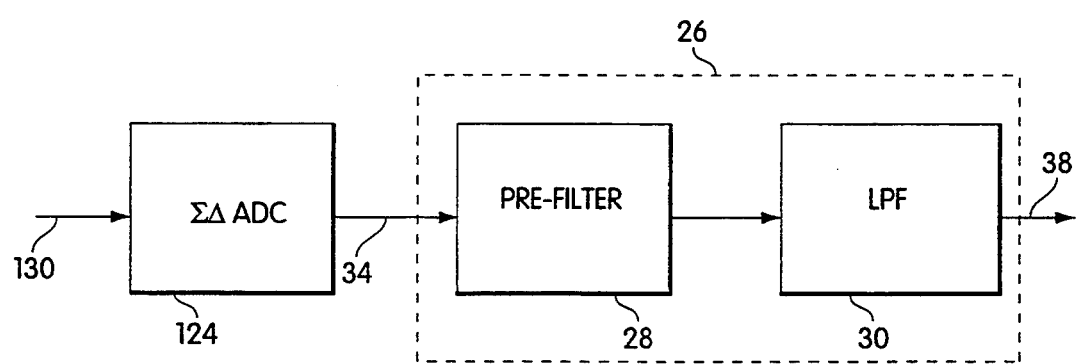
FIG. 7 is an ADC system of the present invention.

FIG. 7 shows a block diagram of the filter 26 of the present invention used as a decimation filter within a multi-bit sigma-delta ADC system. As shown, the system includes a sigma-delta ADC 124 and a decimation filter 26 including pre-filter 28 and filter 30 according to the present invention. During operation, an analog input signal is received by ADC 124 on analog input lead 130. ADC 124 converts the input signal to an oversampled digital signal and conventionally performs noise shaping on that signal. Decimator 26 decimates (low pass filters) the digital signal received on lead 34 and outputs a filtered digital signal on lead 38. Decimator 26 decimates the digital signal such that quantization noise, a major energy component of which has been shaped to high frequencies, is reduced.

The filter of the present invention offers the advantages that it is simple and economical to implement because of its components. Additionally, the filter has a favorable frequency response characteristic with good stop-band attenuation both near the transition frequency and at higher frequencies. The filter is, therefore, ideal for use in a large class of digital applications. The filter is particularly well suited for use as a decimation filter in a multi-bit, high order, oversampled ADC system.

While there have been shown and described what are at present considered the preferred embodiments of the present invention, which have been disclosed by way of example only, it will be obvious to those skilled in the art that various changes and modifications may be made therein without departing from the spirit and scope of the invention as presented above and as defined by the appended claims and equivalents thereto.

What is claimed is:

1. A digital decimation filter for use in an oversampled analog-to-digital converter system comprising:
   a pre-filter receiving an input digital signal and providing an intermediate output signal, the transfer function of the pre-filter providing generally increasing attenuation with increasing frequency above a predetermined cutoff frequency; and
   a low pass filter, coupled to receive the intermediate output signal from the pre-filter and providing an output digital signal, the low pass filter having a transfer function providing substantially decreasing attenuation with increasing frequency above the cutoff frequency, wherein the low pass filter is an FIR filter including filter coefficients restricted to the set $\{+1, 0$ and $-1\}$.

2. A digital decimation filter as claimed in claim 1 wherein the pre-filter includes means for producing a running sum of a finite number of samples of the input digital signal.

3. A digital decimation filter as claimed in claim 2 wherein the means for producing comprises:
   a first memory element storing the finite number of samples of the input digital signal; and
   a digital adder/subtracter, coupled to the first memory element, for selectively adding to the running sum a new sample in the first memory element and selectively subtracting from the running sum a last sample in the first memory element.

4. A digital decimation filter as claimed in claim 3 wherein the means for producing further includes a second memory element, coupled to the digital adder/subtracter, and operative to store the running sum.

5. A digital decimation filter as claimed in claim 4 wherein the first memory element includes a shift register.

6. A digital decimation filter as claimed in claim 4 wherein the first memory element includes an addressable read/write random access memory element.

7. A digital decimation filter as claimed in claim 1 wherein the input digital signal is a 1-bit digital stream.

8. A digital filter as claimed in claim 1 wherein the input digital signal is an n-bit digital stream.

9. An analog-to-digital converter system comprising:
an oversampled analog-to-digital converter, receiving as an input, an analog signal and providing, as an output, a digital signal; and
a digital decimation filter, coupled to the analog-to-digital converter, the digital decimation filter comprising:
a pre-filter coupled to receive the digital signal and providing an intermediate output signal, the transfer function of the pre-filter providing generally increasing attenuation with increasing frequency above a predetermined cutoff frequency; and
a low pass filter, coupled to receive the intermediate output signal from the pre-filter and providing an output digital signal, the low pass filter having a transfer function providing substantially decreasing attenuation with increasing frequency above the cutoff frequency, wherein the low pass filter is an FIR filter including filter coefficients restricted to the set $\{+1, 0$ and $-1\}$.

10. An analog-to-digital converter system as claimed in claim 9 wherein the analog-to-digital converter is a sigma-delta analog-to-digital converter.

11. An analog-to-digital converter system as claimed in claim 10 wherein the pre-filter includes means for producing a running sum of a finite number of samples of the digital signal.

12. An analog-to-digital converter system as claimed in claim 13 wherein the means for producing comprises:
a first memory element storing the finite number of samples of the digital signal; and
a digital adder/subtracter, coupled to the first memory element, for adding to the running sum a new sample in the first memory element and subtracting from the running sum a last sample in the first memory element.

13. An analog-to-digital converter system as claimed in claim 12 wherein the means for producing further includes a second memory element, coupled to the digital adder/subtracter, and operative to store the running sum.

14. An analog-to-digital converter system as claimed in claim 13 wherein the first memory element includes a shift register.

15. An analog-to-digital converter system as claimed in claim 13 wherein the first memory element includes an addressable read/write random access memory element.

16. An analog-to-digital converter system as claimed in claim 13 wherein the second memory element is initialized by setting the value of the second memory element to zero while the input to the analog-to-digital converter is connected to an analog potential for which the output of the analog-to-digital converter is desired to be zero.

17. An analog-to-digital converter system as claimed in claim 9 wherein the digital signal is an n-bit digital stream where n is a positive integer.

18. A method for decimating a digital input signal comprising the steps of:
receiving the digital input signal from an oversampled analog-to-digital converter;
pre-filtering the digital input signal with a pre-filter having a transfer function providing generally increasing attenuation with increasing frequency above a cutoff frequency, to produce an intermediate output signal; and
using an FIR filter including filter coefficients restricted to the set $\{+1, 0$ and $-1\}$, low pass filtering the intermediate output signal with a low pass filter, coupled to the pre-filter, having a transfer function providing substantially decreasing attenuation with increasing frequency above the cutoff frequency, to produce an output signal.

19. A digital decimation filter for use in a multi-bit oversampled analog-to-digital converter system comprising:
a pre-filter, receiving a multi-bit input digital signal and providing an intermediate output signal, the transfer function of the pre-filter providing generally increasing attenuation with increasing frequency above a predetermined cutoff frequency; and
a low pass filter, coupled to receive the intermediate output signal from the pre-filter and providing an output digital signal, the low pass filter having a transfer function providing substantially decreasing attenuation with increasing frequency above the cutoff frequency.

20. A multi-bit analog-to-digital converter system comprising:
a multi-bit oversampled analog-to-digital converter, receiving as an input, an analog signal and providing, as an output, a multi-bit digital signal; and
a digital decimation filter, coupled to the analog-to-digital converter, the digital decimation filter comprising:
a pre-filter coupled to receive the multi-bit digital signal and providing an intermediate output signal, the transfer function of the pre-filter providing generally increasing attenuation with increasing frequency above a predetermined cutoff frequency; and
a low pass filter, coupled to receive the intermediate output signal from the pre-filter and providing an output digital signal, the low pass filter having a transfer function providing substantially decreasing attenuation with increasing frequency above the cutoff frequency.

21. A method for decimating a multi-bit digital input signal comprising the steps of:
receiving the multi-bit digital input signal from a multi-bit oversampled analog-to-digital converter;
pre-filtering the multi-bit digital input signal with a pre-filter having a transfer function providing generally increasing attenuation with increasing frequency above a cutoff frequency, to produce an intermediate output signal; and
low pass filtering the intermediate output signal with a low pass filter, coupled to the pre-filter, having a transfer function providing substantially decreasing attenuation with increasing frequency above the cutoff frequency, to produce an output signal.

* * * * *

UNITED STATES PATENT AND TRADEMARK OFFICE
CERTIFICATE OF CORRECTION

PATENT NO. : 5,450,083

DATED : September 12, 1995

INVENTOR(S) : Robert J. Brewer

It is certified that error appears in the above-identified patent and that said Letters Patent is hereby corrected as shown below:

In column 9, claim 12, line 41, change "13" to —11—.

Signed and Sealed this

Fifth Day of December, 1995

Attest:

BRUCE LEHMAN

Attesting Officer

Commissioner of Patents and Trademarks